May 17, 1960 W. R. KENNEDY 2,937,357

ELECTRICAL CONNECTOR FOR PRINTED CIRCUITS

Filed Jan. 20, 1955 2 Sheets-Sheet 1

WILLIAM R. KENNEDY,
INVENTOR.

BY [signature]

ATTORNEY.

May 17, 1960 W. R. KENNEDY 2,937,357

ELECTRICAL CONNECTOR FOR PRINTED CIRCUITS

Filed Jan. 20, 1955 2 Sheets-Sheet 2

WILLIAM R. KENNEDY,
INVENTOR.

BY Gerald H. Peterson

ATTORNEY.

2,937,357

ELECTRICAL CONNECTOR FOR PRINTED CIRCUITS

William R. Kennedy, Playa Del Rey, Calif.

Application January 20, 1955, Serial No. 482,916
17 Claims. (Cl. 339—17)

This invention relates to an electrical connector and more particularly to an electrical connector for connecting a multiplicity of electrical lead wires to the series of electrical contacts on one or both sides of one edge of a printed circuit board.

As known in the art, the printed, or etched, circuit board is used as a base for electrical components of various kinds such as resistors, condensers, vacuum tubes and inductances electrically interconnected by printed or etched circuits on the board. Usually such a board is made by coating both sides with a thin metal sheet, as, for example, a thin sheet of copper. Then by a chemical etching process all of the copper is removed except for strips used for the purpose of electrical connections. These strips left on the board replace the electrical wires formerly used for connecting the electrical components in the desired circuit. For the purpose of making electrical contact with electrical leads brought up to such a board, the strips extend to positions uniformly spaced along one edge of the board and thus form along the edge a row of uniformly spaced contacts for making electrical contact with lead wires from electrical wiring outside of or external to, the circuit on the board. In many cases identical circuits are placed on the opposite flat sides of such a board and identical contacts are formed on each side of the connecting edge of the board.

Electrical connectors are also known for connecting a multiplicity of lead wires to the contacts on each side of one edge of such a printed circuit board which make a connection between the multiplicity of the contacts on the board and a multiplicity of contact clips in the connector and thereby to a multiplicity of outside wires into which connector the edge of the board carrying the contacts is pushed to make connection and pulled out for disconnection. Such old connectors usually comprise a multiplicity of contact clips, corresponding in number and spacing with the contacts on the board, held in a row in a supporting member so that the contact edge of the board may be inserted in the row of contact clips to make the desired multiplicity of connections between the clips and the contacts on the edge of the board. The lead wires from the outside are usually connected to the contact clips by soldering. Such connectors also usually have some polarizing device cooperating with a means on the printed circuit board so the board can be inserted into the connector only the one way assuring the right polarization of the electrical circuits. Such connectors, however, of which I am aware, are relatively unsatisfactory in use.

In accordance with my invention I have provided an improved electrical connector useful primarily for this purpose which is more satisfactory in use.

Accordingly, it is an object of my invention to provide such an electrical connector which is relatively simple, relatively easy and economical to make and more effective and satisfactory in use.

It is another object of my invention to provide such an electrical connector in which the contact clips are firmly held in position in the supporting body member by a simple structural arrangement.

It is another object of my invention to provide such a connector in which the contact clips are so arranged within the supporting body member that the contact edge of the printed circuit board may be inserted readily without interference by the outwardly extending portions of the clips, even though the contact edge of the printed circuit board is inserted a little to one side of the central position within the connector.

It is another object of my invention to provide such an electrical connector in which the lead wires are connected to contact clips by tapered pins instead of by soldering.

It is another object of my invention to provide such a connector in which each contact clip is adapted to receive two lead wires with a common electrical connection therebetween provided by the contact clip.

It is still a further object of my invention to provide such an electrical connector having simple and effective polarizing elements which are readily inserted in position in the connector and which effectively cooperate with polarizing means along the contact edge of the printed circuit board.

Other objects and advantages of my invention will be apparent from the description below.

In general, one embodiment of the electrical connector in accordance with my invention comprises an elongated supporting body member holding a row of aligned and uniformly spaced electrical contact clips, each of which has two backwardly extending and outwardly tapered tubular members for receiving tapered contact pins at the ends of lead wires, a structural bridging member between the tapered tubular members for both electrical connection and substantially rigid structural connection therebetween and for holding the clips from being moved backward within the body member, each of said tubular members having forwardly extending members with resilient contact elements adapted to receive and press against opposite contacts of the contact edge of a printed circuit board. The back portion of the body member has a row of pairs of cylindrical holes tapered outwardly at the back end portions thereof to conform to the taper of the tubular members with tapered pins inserted therein. Within the front portion of the body member there is an elongated cavity with a series of spaced ribs on each innerside thereof for holding and mechanically and electrically separating each pair of the forwardly extending resilient contact elements from adjacent pairs.

Each of the contact clips is fixed in position within the body member by providing a short length of each of said tubular members extending outwardly beyond the flat back surface of the body member and preferably flaring the outwardly extending portion of the tubular member against the back surface of the back member to hold the contact clip in position in the body member. With this arrangement the two tubular members are held in the pair of holes and the flared portion holds them from moving forward while the bridge member against the bottom surface of the cavity prevents them from moving backward.

Preferably the connector in accordance with my invention also carries one or more polarizing elements, each of which may be inserted in place of a contact clip, comprising a flat forwardly extending portion adapted to fit cooperatingly into a polarizing slot in the contact edge of the printed circuit board and an elongated backwardly extending portion adapted to fit through one of the pair of holes in the body member which is bent across the back surface thereof to hold it firmly in position within the body member.

My invention will now be more particularly described and illustrated by the description below of a specific embodiment thereof in connection with the accompanying drawings in which.

Figures 1, 2, 3, 4, 5:
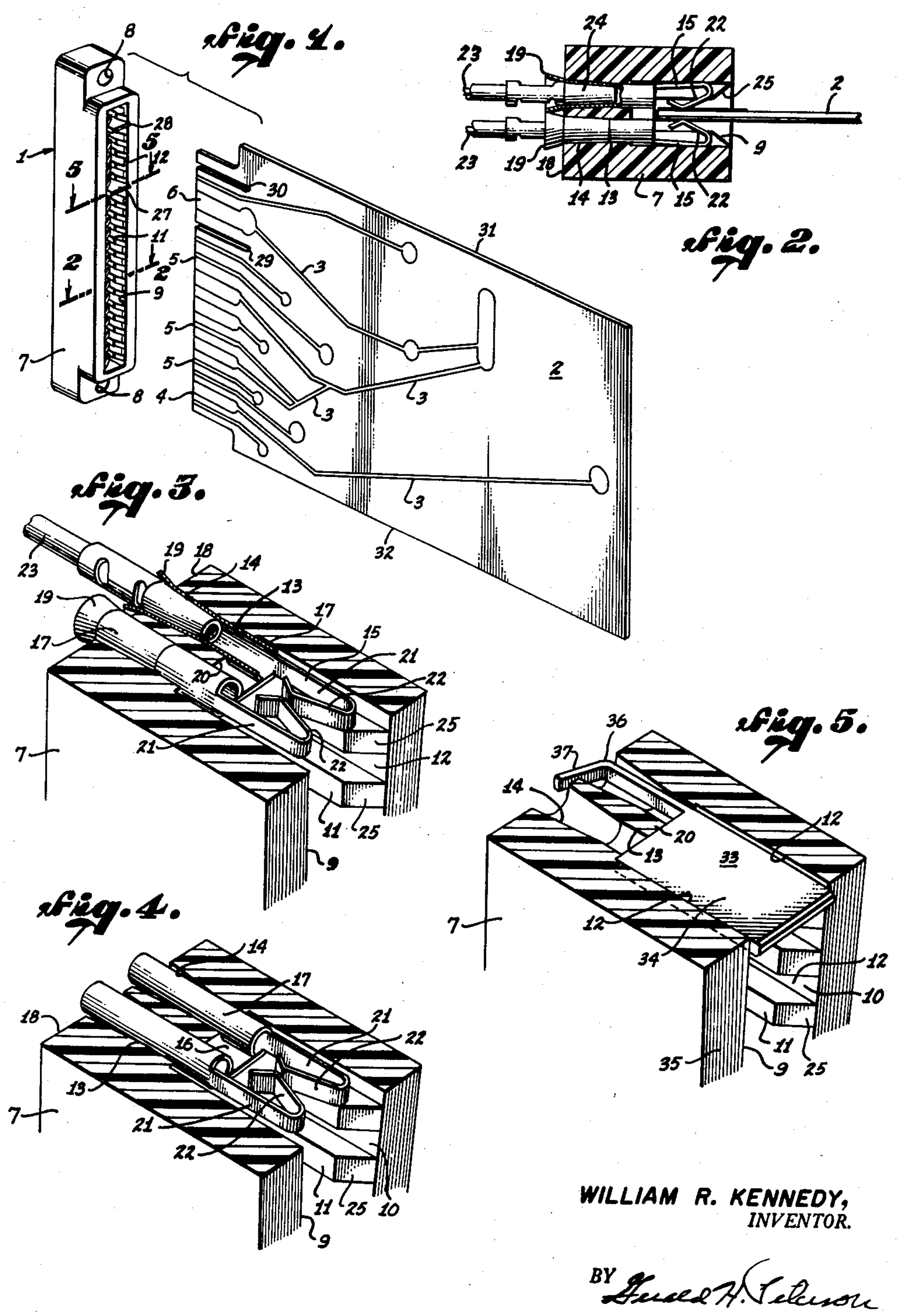
Fig. 1 shows a connector in accordance with my invention in relation to a printed circuit board having the connecting edge thereof facing the connector in a position about to be inserted into the front elongated cavity of the connector for making connection.
Fig. 2 shows in elevation a cross-section on the line 2—2 of the connector shown in Fig. 1 with a contact clip having one of the tapered tubular elements in cross-section and with the contact edge of the printed circuit board inserted within the elongated cavity at the front of the connector with the contact edge between the resilient contact elements of the clip.
Fig. 3 is a perspective view in cross-section substantially on the lines 2—2 of the contact in Fig. 1 showing a contact clip in position within the body member with one of the tapered tubular members in cross-section having a tapered pin at the end of a lead wire connected therewithin.
Fig. 4 is a view similar to that in Fig. 3 showing a step in placing a clip in position within a pair of holes in the body member before the outwardly and backwardly extending ends of the tubular members have been flared for firmly positioning in the body member.
Fig. 5 is a perspective view substantially on the lines 5—5 of the connector shown in Fig. 1, particularly showing a polarizing element in place in the connector instead of a clip in accordance with the invention.

Referring to Fig. 1, there is shown generally at 1 a connector in accordance with my invention intended primarily to be used with such a printed circuit board shown generally at 2. On one side of the printed circuit board are metal strips, some of which are indicated by numerals 3 which provide electrical connections to contacts along the edge 4 of the board 2, one of which is indicated at 5. The contacts 5, as understood in the art, are usually uniformly spaced along the length of edge 4 to conveniently match with the similarly uniformly spaced contact elements in the connector. As understood in the art, some of these contacts along the edge 4 of the board, as, for example, the one shown at 5, may correspond to a single contact in the connector, whereas one as shown at 6, for example, may make contact with two of the contact elements within the connector. Frequently printed circuit boards have duplicate circuits on each side of the board in which case the contacts 5 and 6 along edge 4 will be identical on each side. The electrical connector in accordance with my invention is especially useful for such a printed circuit board having duplicate circuits on each side, although, of course, it may be used for such a printed circuit board having circuits on only one side.

The electrical connector shown generally at 1 comprises a body member 7, of insulating material such as plastic, generally elongated and adapted to hold a row of contact clips within an elongated front cavity 9 for making contact with the contacts 5 and 6 along the contact edge 4 of the printed circuit board when this edge is inserted within the connector. Front cavity 9 corresponds in length with edge 4 so that the edge 4 of the printed circuit board just fits within and is properly positioned lengthwise within the cavity to make the desired contacts along the rows of clips and contacts 5 and 6. Holes 8 may be provided at each end of the body member 7 so that it may be mounted by means of screws to a convenient support, as understood in the art. The body member 7, in the front portion facing the contact edge 4, has an elongated cavity 9 having inner side walls 10 with inwardly extending and spaced ribs 11 with grooves 12 therebetween. The cavity 9, ribs 11 and grooves 12 extend into body member 7 a little more than about half way, as shown in Figs. 2 and 3. Extending backward from each of the grooves 12 are holes 13 in the body portion, the back portion 14 of which is slightly tapered outwardly as shown in Figs. 2, 3, 4 and 5. Holes 13 are arranged in a row of pairs of such holes in the body portion to receive the pairs of tubular members of the contact clips.

Figure 6:
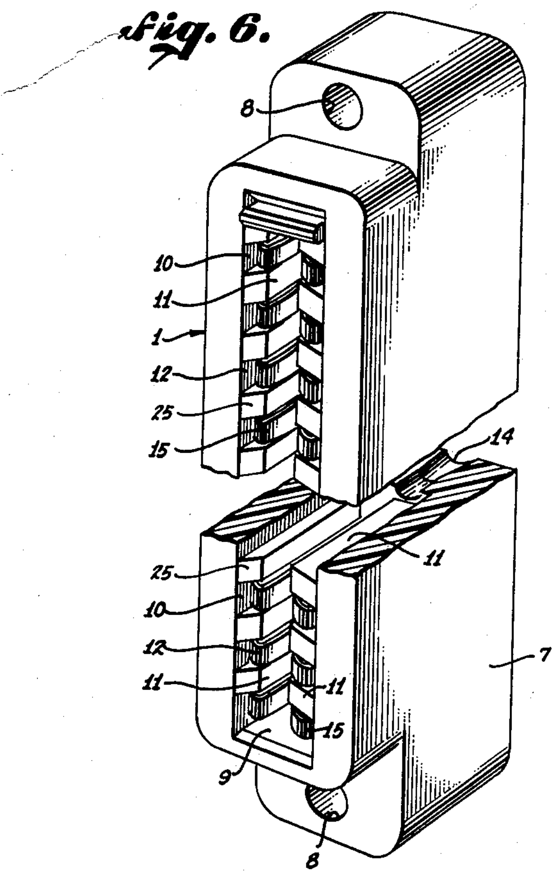
Fig. 6 is a perspective view of the front of the connector with middle section broken away and with the view enlarged to show the arrangement of contact clips in a row with the front cavity of the connector.
Figure 7:
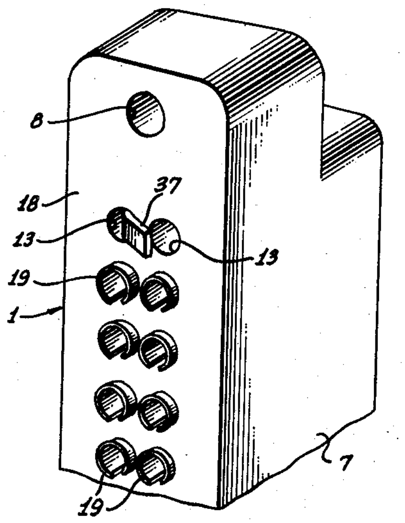
Fig. 7 is a perspective view of the upper portion of the back of the connector.

Within the body member 7 is a row of uniformly spaced contact clips 15 such as shown particularly in Figs. 2, 3 and 6. Each of these contact clips comprises a transverse bridge member 16 carrying a pair of backwardly extending tubular members 17 which fit in a pair of holes 13 in the body member. These tubular members extend backwardly beyond the back surface 18 of the body member into a flared portion 19, which holds the tubular members 17 firmly in position within the holes 13 with the bridge member 16 in contact with the bottom surface 20 of the cavity 9 so that the two tubular members 17 and bridge member 16 are firmly and rigidly held in position within the body members.

Extending forwardly from the pair of tubular members 17 and within grooves 12 is a pair of flat strips 21 each having an inwardly bent portion 22 providing a resilient contact element. Each pair of these resilient contact elements 22 is adapted to receive resiliently a portion of contact edge 4 of the printed circuit board as particularly illustrated in Fig. 2 and with the two contact elements 22 pressing against contacts 5 on opposite sides of the printed circuit board.

Outside lead wires 23 carrying tapered pins 24 are adapted to be inserted into the tapered portion of the tubular elements 17 so that there is surface contact between the conical surface of the tapered portion of the tubular member 17. The pins may be inserted easily and, once firmly inserted, are tightly held in place. This provides an arrangement whereby very satisfactory and effective electrical contacts of low resistance can be made between outside lead wires and the contact clips. Moreover, two outside leads, as particularly shown in Fig. 2, can be electrically connected to each of the contact clips 15 from the back of the connector. In the specific embodiment here shown the taper of both the pins 24 and tapered back portion of the tubular member 17 is about 3½°.

In assembling to make the connector the contact clips 15 are preferably made up with the tubular elements 17 in the form of longitudinally split cylinders, and are inserted from the front of the body member by way of cavity 9 with the tubular member 17 first inserted in opposite grooves 12 and pushed back through holes 13 until the bridge element 17 contacts the bottom surface 20 of cavity 9. The back ends of cylindrical members 17 are then tapered to the extent necessary to match the tapered pins 24. For this purpose the back ends of holes 13 are tapered as shown at 14, as described above. With the small portion of the ends of tubular member 17 projecting beyond the back 18 of body member 7, and the bridge member 16 in contact with the bottom surface 20 of cavity 9, the back protruding ends 9 are flared, as shown at 19 in Figs. 2 and 3, to hold the contact clips in position as described above.

Figure 8:
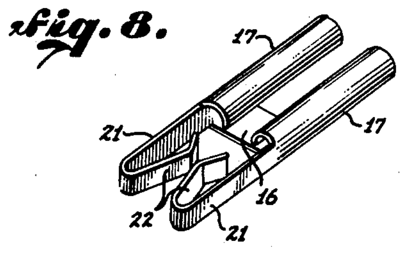
Fig. 8 is a perspective view of one of the contact clips before insertion into the connector body.

The contact clips may desirably be made of 0.008" thick beryllium copper fabricated into the shape shown in Figs. 4 and 8 and, when in position in the connector, into the shape shown in Fig. 3.

Figure 9:
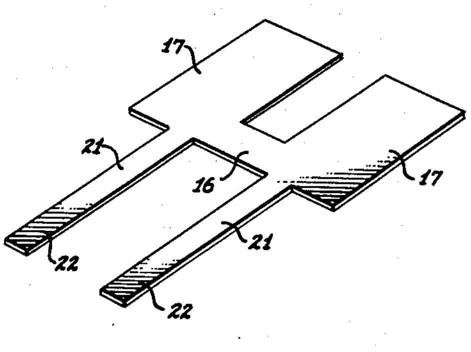
Fig. 9 shows a flat member from which the contact clip of Fig. 8 is formed.

Preferably the contact clip as shown in Fig. 8 is made from a flat piece as shown in Fig. 9. The flat portions 17 of Fig. 9 are turned into the longitudinally split cylinders 17 of Fig. 8, and the strips 21 are bent into the contact elements 22 of Fig. 8. They are preferably properly heat treated to obtain the desired strength and resiliency, especially for contact elements 22, and plated with silver and gold to improve electrical conductivity and corrosion resistance. The body member 7 is made of non-conducting material such as plastic.

The metal strips 21 extend forwardly from the bridge members 16 short of the forward ends of ribs 11 so that the outer ends of resilient contact elements 22 lie below the outer ends of the ribs and the ribs 11 are tapered at their outer surfaces 25 to guide the contact edge 4 of the printed circuit board into the proper position between the contact elements 22 as shown in Fig. 2. Thus it will be seen that, at the entrance to the space between contact elements 22, the forward ends of the ribs guide the board to the proper position between the contact elements 22 and prevent any chance catching of the edge of the board on the forward edges of the contact elements 22 or behind the strips 21. With this relationship of the forward protruding elements 21, contact elements 22, and the ribs 11, it will be seen that there is no tendency for the contact edge 4 of the printed circuit board to catch on the contact clips as it is being inserted within the connector. This relationship is particularly illustrated in Figs. 2 and 3.

Each of the contact clips in accordance with the invention may be readily removed and replaced by removing the flare at 19, as with a cutting tool or other suitable tool, then taking out the contact clip, inserting a new one as shown in Fig. 4 and tapering and flaring as shown in Fig. 3.

Preferably in combination with the connector of my invention, there will also be used polarizing elements 27 and 28 adapted to fit into polarizing slots 29 and 30 respectively in the printed circuit board to assure that edge 31 is up when the board is inserted in the connector instead of the edge 32. This assures the proper polarization with respect to connection of the electrical circuits. In the connector, in accordance with my invention, these polarizing elements may be inserted in place of one or more of the contact clips. This is particularly illustrated in Fig. 5. Here is shown a polarizing element 33 within opposite grooves 12. The flat portion 34 of the polarizing element extends between the bottom surface 20 of cavity 9 substantially flush with the front surface 35 of the body member 7. Extending backwardly from the flat portion 34 of polarizing element 33 is member 36 adapted to fit in one of the holes 13 and is bent as at 37 to hold the polarizing element in position within the body member. This provides a very effective polarizing device in combination with the connector of my invention which may be readily inserted and fixed in position or readily removed as desired.

The specific embodiments given above are for the purpose of illustrating my invention, and it will be readily understood that my invention includes other modifications within the scope of the following claims.

I claim:

1. In an electrical connector for connecting a multiplicity of lead wires to a corresponding multiplicity of electrical contact elements on an edge of a printed circuit board, an electrically insulating elongated body member, a row of contact clips held in position within said elongated body member with the front contacting portions of said row of contact clips within an elongated cavity in the front of said body member adapted to receive and resiliently contact a corresponding row of electrical contact elements on the edge of the printed circuit board, said cavity corresponding in length with the length of the edge of said printed circuit board so that said edge fits into position within said cavity to make the desired multiplicity of electrical contacts between said front contacting portions of the clips and said elements, each said contact clips having a tubular portion tapering outwardly and extending backward from said cavity beyond the back surface of said body member through holes therein to hold said clips in contacting position within said body member and providing a socket for a tapered contact pin on the end of a lead wire for connecting the back portions of said clips to outside electrical lead wires, said clips having means adjacent the end of said portion near the bottom of said cavity holding said clips against backward movement within said body member and said portion having means adjacent the back surface of said body member holding said tubular portion from forward movement therewithin when said tapered pin is inserted within said socket.

2. In a connector as defined in claim 1, in which each of said contact clips has an outwardly flared tubular portion extending backward from said cavity beyond the back surface of said body member through a correspondingly outwardly flared hole therein to hold said clips in contacting position within said body member and to provide means for connecting the back portions of said clips to outside electrical lead wires and to resist forward movement of said portion within said hole.

3. In a connector as defined in claim 2 in which the back portion of said tubular portion is tapered outwardly to conform substantially to the taper of said pin so that said pin fits tightly therewithin making a firm electrical connection with surface contact between the outer surface of said pin and the inner surface of the tapered portion of said tubular portion.

4. In a connector as defined in claim 1 in which said means adjacent the back surface of said body member comprises an outwardly flared portion of that portion of said tubular member extending beyond the back surface of said body member.

5. In a connector as defined in claim 1 in which each of said contact clips has a flat portion extending forward in said cavity with the front end thereof bent backward to form an electrical contact adapted to resiliently press against a contact element on the edge of the printed circuit board when in position within said row of contact clips.

6. In a connector as defined in claim 5 in which said flat portion extends forward within a groove in the inner side wall of said cavity holding said flat portion and its electrical contact on the front end thereof in position within said cavity.

7. In a connector as defined in claim 6 in which said flat portion and front bent end thereof lie within said groove and said contact protrudes beyond said groove only at a position substantially within the depth of said cavity so that the edge of said printed circuit board upon being inserted into said cavity will not contact the outer ends of said flat portions but only the inwardly extending contact portions thereof to avoid catching of said edge on said contact as inserted into connecting position.

8. In a connector as defined in claim 1 in which each of said contact clips has a pair of tubular portions extending backward from said cavity beyond the back surface of said body member through a corresponding pair of holes therein.

9. In a connector as defined in claim 8 in which each of said tubular portions has a forwardly extending flat portion each of which is bent backward to form an electrical contact adapted to resiliently press against opposite contact elements on the edge of the printed circuit board when in position within said row of contact clips.

10. In a connector as defined in claim 9 in which each of said tubular portions is tapered at the back end thereof to conform substantially to the taper of tapered pins on the ends of outside electrical lead wires so that said pins fit tightly within the back ends of said tubular portions making a firm electrical connection with surface contact between the outer surface of said pins and the inner surface of the tapered portions.

11. In a connector as defined in claim 10 in which the portions of said tubular portions extending beyond the back surface of said body member carry means holding them against forward movement within said body member and said tubular portions have a bridging member therebetween within said cavity holding them against backward movement within said body member.

12. In a connector as defined in claim 11 in which that portion of said tubular portions extending beyond the back surface of said body member is flared outwardly to hold them against said movement within said body member.

13. In a connector as defined in claim 9 in which each of said forwardly extending flat portions extends in grooves between ribs on the inside walls of said cavity to hold said contacts in position therewithin.

14. In a connector as defined in claim 13 in which said forwardly extending flat portions and contacts lie within said grooves below said ribs and said contacts protrude beyond said grooves only at a position substantially within the depth of said cavity and the front edges of said grooves are sloped to guide the edge of the printed circuit board to a position between the resilient contacts without catching on the outer ends thereof.

15. In a connector as defined in claim 9 having polarizing means for correctly polarizing the connections made between the contact clips and the contact elements on the printed circuit board comprising a flat member extending forwardly in said cavity and adapted to fit within a polarizing slot on the contact edge of the printed circuit board, said flat portion carrying a backwardly extending member adapted to fit within a hole in the body member and means on the outer end thereof for holding said flat member against forward movement within said body member.

16. An electrical contact clip comprising a pair of longitudinally extending parallel spaced tubular cylinder members, each of which is connected at one end with a bridging member extending therebetween, each of said cylindrical members having a flat strip extending forwardly therefrom and from said bridging member and substantially parallel with said tubular cylinder members bent backwardly and toward one another at each end to form a resilient contact element therebetween adapted to resiliently engage opposite sides of the contact edge of a printed circuit board.

17. In an electrical connector for connecting a multiplicity of lead wires to a corresponding multiplicity of electrical contact elements on an edge of a printed circuit board, an electrically insulating body member, a row of contact clips held in position within said elongated body member with the front contacting portions of said row of contact clips within an elongated cavity in the front of said body member adapted to receive and resiliently contact a corresponding row of electrical contact elements on the edge of the printed circuit board, said cavity corresponding in length with the length of the edge of said printed circuit board so that said edge fits into position within said cavity to make the desired multiplicity of electrical contacts between said front contacting portions of the clips and said elements, each said contact clips having a tubular portion extending backward from said cavity beyond the back surface of said body member through holes therein to hold said clips in contacting position within said body member and providing a socket for a contact pin on the end of a lead wire for connecting the back portions of said clips to outside electrical lead wires, said clips having means adjacent the end of said portion near the bottom of said cavity holding said clips against backward movement within said body member and said portion having means adjacent the back surface of said body member holding said tubular portion from forward movement therewithin when said contact pin is inserted within said socket.

References Cited in the file of this patent

UNITED STATES PATENTS

| | | |
|---|---|---|
| 1,078,751 | Rogers | Nov. 18, 1913 |
| 1,382,129 | Shields | June 21, 1921 |
| 1,475,257 | Bottone | Nov. 27, 1923 |
| 1,494,954 | Crouch | May 20, 1924 |
| 1,718,529 | Coldwell | June 25, 1929 |
| 1,854,328 | Binder | Apr. 19, 1932 |
| 2,255,553 | Funk | Sept. 9, 1941 |
| 2,401,430 | Lake | June 4, 1946 |
| 2,425,670 | Buell | Aug. 12, 1947 |
| 2,457,703 | Merkel | Dec. 28, 1948 |
| 2,659,872 | Gilbert | Nov. 17, 1953 |
| 2,664,552 | Ericsson et al. | Dec. 29, 1953 |
| 2,701,346 | Powell | Feb. 1, 1955 |
| 2,765,450 | Richardson | Oct. 2, 1956 |
| 2,783,417 | Eannarino | Feb. 26, 1957 |

OTHER REFERENCES

A.M.P., "Electrical Mfg.," August 1953, page 143.